(12) United States Patent
Fahlenkamp et al.

(10) Patent No.: US 10,879,806 B2
(45) Date of Patent: Dec. 29, 2020

(54) VOLTAGE CONVERTER CONTROLLER, VOLTAGE CONTROLLER AND CORRESPONDING METHODS

(71) Applicant: Infineon Technologies Austria AG, Villach (AT)

(72) Inventors: Marc Fahlenkamp, Geretsried (DE); Martin Krueger, Oberschleissheim (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/162,847

(22) Filed: Oct. 17, 2018

(65) Prior Publication Data

US 2019/0115837 A1 Apr. 18, 2019

(30) Foreign Application Priority Data

Oct. 18, 2017 (DE) .................. 10 2017 124 301

(51) Int. Cl.
*H02M 3/335* (2006.01)
*G01R 19/165* (2006.01)
*H02M 1/42* (2007.01)
*H02M 1/00* (2006.01)
*H02M 3/28* (2006.01)

(52) U.S. Cl.
CPC .. *H02M 3/33507* (2013.01); *G01R 19/16528* (2013.01); *H02M 1/4208* (2013.01); *H02M 3/285* (2013.01); *H02M 2001/007* (2013.01); *H02M 2001/008* (2013.01); *H02M 2001/0032* (2013.01); *H02M 2001/0058* (2013.01)

(58) Field of Classification Search
CPC ......... H02M 3/33538; H02M 3/33546; H02M 3/33515; H02M 3/33576; H02M 3/33553; H02M 3/33507; H02M 3/33592; H02M 3/33523; H02M 3/3353; H02M 3/33569; H02M 1/12; H02M 1/42; H02M 1/4225; H02M 1/4233; H02M 1/4241; H02M 1/4258; H02M 1/425; H02M 1/4208; H02M 2001/4283; H02M 2001/4291; H02M 2003/1552; H02M 7/49; H02M 3/1582; H02M 3/1584; H02M 3/285; H02M 3/33561; H02J 3/38; H02J 3/46
See application file for complete search history.

(56) References Cited

U.S. PATENT DOCUMENTS

| | | | |
|---|---|---|---|
| 2004/0174724 A1* | 9/2004 | Mitev | H02M 1/12 363/40 |
| 2006/0192774 A1* | 8/2006 | Yasumura | H02M 1/10 345/211 |
| 2007/0145956 A1* | 6/2007 | Takeuchi | H02M 1/4225 323/207 |

(Continued)

FOREIGN PATENT DOCUMENTS

DE 102013102855 A1 10/2013

*Primary Examiner* — Bryan R Perez
(74) *Attorney, Agent, or Firm* — Murphy, Bilak & Homiller, PLLC

(57) ABSTRACT

Voltage converter controllers, voltage converter systems and corresponding methods are provided. In normal operation, a voltage converter stage of the system is controlled based on a feedback voltage from an output. In a low power mode, the system is controlled based on a supply voltage provided to a controller of the system.

20 Claims, 6 Drawing Sheets

(56) References Cited

U.S. PATENT DOCUMENTS

2014/0355315 A1* 12/2014 Watanabe ......... H02M 3/33546
                                                      363/21.09
2015/0055380 A1*  2/2015 Motoki ................... H02M 1/10
                                                      363/21.17
2017/0366092 A1* 12/2017 Langeslag ......... H02M 3/33523
2018/0226894 A1*  8/2018 Teo ......................... H02M 1/08

* cited by examiner

VOLTAGE CONVERTER CONTROLLER, VOLTAGE CONTROLLER AND CORRESPONDING METHODS

TECHNICAL FIELD

The present application relates to voltage converter controllers, voltage converters and corresponding methods.

BACKGROUND

Voltage converters are used to convert an input voltage to an output voltage and are for example frequently used in power supplies to generate a voltage needed by a certain appliance based on an external supply voltage, for example a mains power voltage. Voltage converters include AC/DC (alternating current/direct current) converters, DC/DC converters or DC/AC converters. One class of such voltage converters include switched mode power supplies (SMPS). An SMPS uses controlled charging and discharging of an inductor or transformer by operating one or more switches with a switching frequency and is an efficient way to convert power. SMPS include buck converters, boost converters, flyback converters or resonant converters like LLC (inductor-inductor-capacitor) converters.

In some applications, voltage converters are required to support both operation with high load, for example when a device supplied by the voltage converter is in normal operation (full load), as well as in light load conditions like a standby operation, where little power is required. This will also be referred to as low power mode herein. For example, for television systems, in normal operation a power greater than 90 W may be required, while during a standby mode standby powers smaller than 50 mW may be desirable or even required.

For full load operation, frequently a combination of a power factor correction (PFC) stage and a voltage converter stage like a LLC converter stage is used. In some conventional solutions, for light load operation an additional power converter like a flyback converter was provided as an auxiliary supply stage which was operated during low power mode, when the respective main power stage, for example PFC and LLC converter was disabled. However, such auxiliary supply stages were removed in more recent voltage converter systems in order to reduce costs of the voltage converter system.

Without such a dedicated auxiliary supply stage, the main power stage, for example PFC and LLC, has to support the low power mode (light load or no load operation), where only little power is required. However, certain types of converters like LLC converters suffer comparatively high switching losses at light load due to a necessary magnetizing current to ensure zero voltage switching, i.e. switching of switches of the switched mode power supply at a point in time where a voltage at or near zero is applied across the switch. The achievable efficiency for such an LLC converter stage at light load is highly depending on the amount of magnetizing current in comparison to the current needed for energy transfer to a secondary side of the converter to generate an output voltage.

In current solutions, various approaches were made to optimize power consumption during light load operation. Some approaches include lowering an output voltage of an LLC converter and/or disabling a power factor correction (PFC) stage. However, further improvements are desirable to further reduce power consumption during low power mode, for example during standby mode.

SUMMARY

According to an embodiment, a voltage converter controller is provided, comprising: a control circuit; a feedback terminal to receive a feedback signal from a secondary side of a voltage converter system; a supply input to receive a supply voltage; and a switching control output. The control circuit is configured to, in a normal mode of operation, output a switching control signal at the switching control output based on the feedback signal, and wherein, in a low power mode of operation, the voltage converter controller is configured to control the voltage converter system based on a supply voltage received at the supply voltage input.

According to another embodiment, a voltage converter system is provided, comprising: a voltage converter stage; and a voltage converter controller as described above, wherein the voltage converter stage is configured to be controlled by a signal output from the switch control terminal.

According to another embodiment, a method for controlling a voltage converter system is provided, comprising: in a normal mode of operation, controlling at least one of an operating frequency or peak current of a voltage converter stage of the voltage converter system based on an output voltage of the voltage converter stage; and in a low power mode of operation, controlling the voltage converter system based on a supply voltage to a controller of the voltage converter system.

The above summary is merely intended to give a brief overview over some features of some embodiments and is not to be construed as limiting. For example, other embodiments may include other features than the ones explicitly listed above.

DETAILED DESCRIPTION

Figure 1:
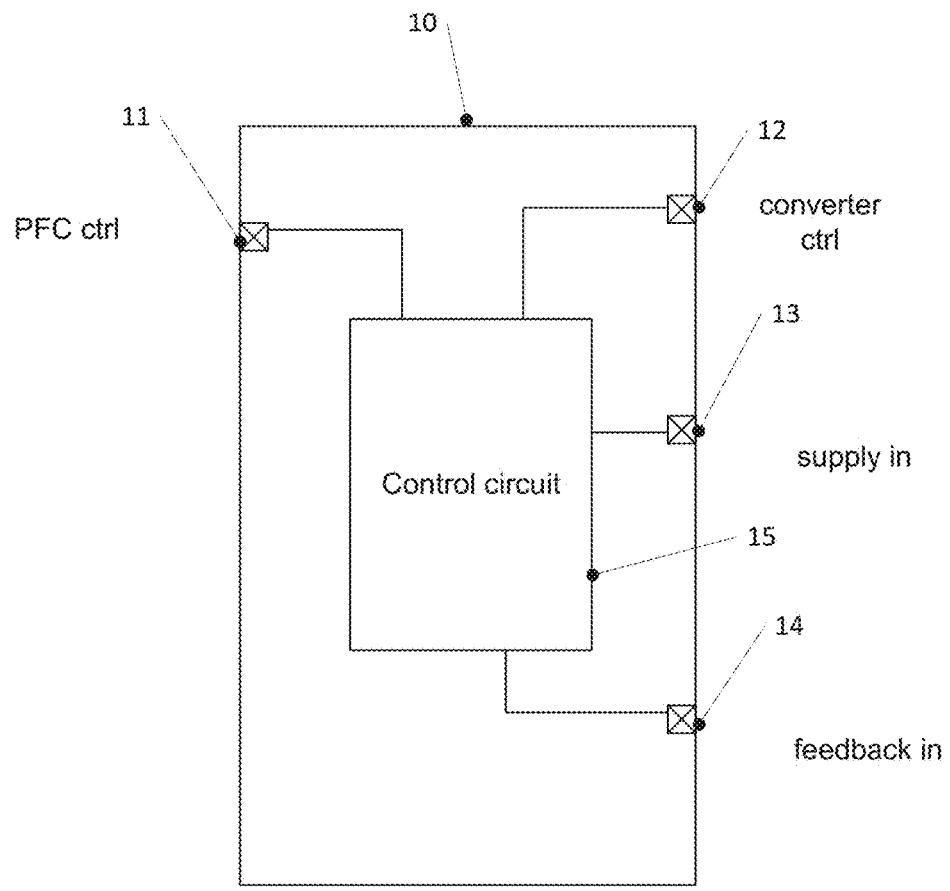
FIG. 1 is a schematic block diagram of a voltage converter controller according to an embodiment.

In the following, various embodiments will be described in detail referring to the attached drawings. It should be noted that these embodiments are given as examples only and are not to be construed in a limiting sense. For example, while embodiments may be described as comprising numerous details or elements, in other embodiments some of these details or elements may be omitted, and/or may be replaced by alternative features or elements. Furthermore, in addition to the features or elements explicitly shown and described, other features or elements, for example features or elements used in conventional voltage converter systems, may be provided.

Features from different embodiments may be combined to form further embodiments. Variations and modifications described for one of the embodiments may also be applicable to other embodiments.

Electrical connections or couplings shown in the drawings or described herein may be modified as long as the general purpose of the connection or coupling, for example transmit a certain kind of signal or a certain kind of information, is not significantly altered. For example, intervening elements may be added to or removed from electrical connections or couplings as long as this essentially does not change the general purpose of the connection or coupling.

In some embodiments, specific voltage converter architectures are used as non-limiting examples, for example a combination of a power factor correction (PFC) stage with an LLC converter. However, concepts described herein may also be applicable to other kinds of converters, for example other resonant converters than LLC converters. Therefore, giving specific examples is not be construed as limiting.

In the context of the present application, normal mode or regular operation is used to refer to a mode of operation where a voltage converter system is able to output full power to supply corresponding circuits. Low power mode is used to refer to a mode of operation where the output power is reduced, for example during a standby mode.

In some embodiments, in a voltage converter at least two modes of operation are used. In a first mode of operation, for example a normal operation where a full load may be supplied, a regulation is based on a feedback voltage related for example to an output voltage of the voltage converter. In a second mode of operation, which may be used for light load operations like a standby mode, i.e. in a low power mode regulation may be made based on a supply voltage supplied to a controller.

Turning now to the figures, FIG. 1 illustrates a block diagram of a voltage converter controller 10 according to an embodiment implementing techniques discussed herein. Voltage converter controller 10 of FIG. 1 is shown as comprising a power factor correction (PFC) control terminal 11, a converter control terminal 12, a supply input terminal 13 and a feedback input terminal 14. Controller 10 of FIG. 1 further comprises a control circuit 15. Control circuit 15 may for example comprise a logic circuit or a specifically programmed processor to implement functions as discussed herein, but is not limited thereto.

Controller 10 is supplied via terminal 13 with a supply voltage enabling its operation. In normal operation, when a voltage converter system controlled by controller 10 outputs a high power to supply an appliance, control circuit 15 receives a feedback signal indicative of an output load and/or output voltage of the voltage converter system and controls a power factor correction stage via terminal 11 and/or a converter stage like an LLC converter or other resonant converter via terminal 12. In particular, a switching frequency of switches of the converter stage may be regulated using terminal 12.

Furthermore, in some embodiments during a low power mode (e.g. light load operation or standby) feedback via feedback terminal 14 may be disabled or disregarded. Control circuit 15 in this low power mode performs a regulation based on a supply voltage at terminal 13, for example to perform the regulation such that the supply voltage is above a required minimum voltage for operation of control circuit 15. In some embodiments, this regulation may be done by only regulating a voltage output of the power factor correction stage or other primary stage via terminal 11, while leaving a switching frequency regulated via terminal 12 at a fixed value, for example at an optimum value for the respective converter regarding loss. In other embodiments, at least in some cases also the switching frequency may be modified. Examples for such regulation during low power mode will be given further below. In other embodiments, instead of the switching frequency a peak current may be controlled. Such a controlling of the peak current may for example be performed in an LLC converter where the voltage at the resonant tank is measured and compared with the feedback voltage to determine an on-time for a corresponding switching cycle of the LLC converter.

Figure 2:
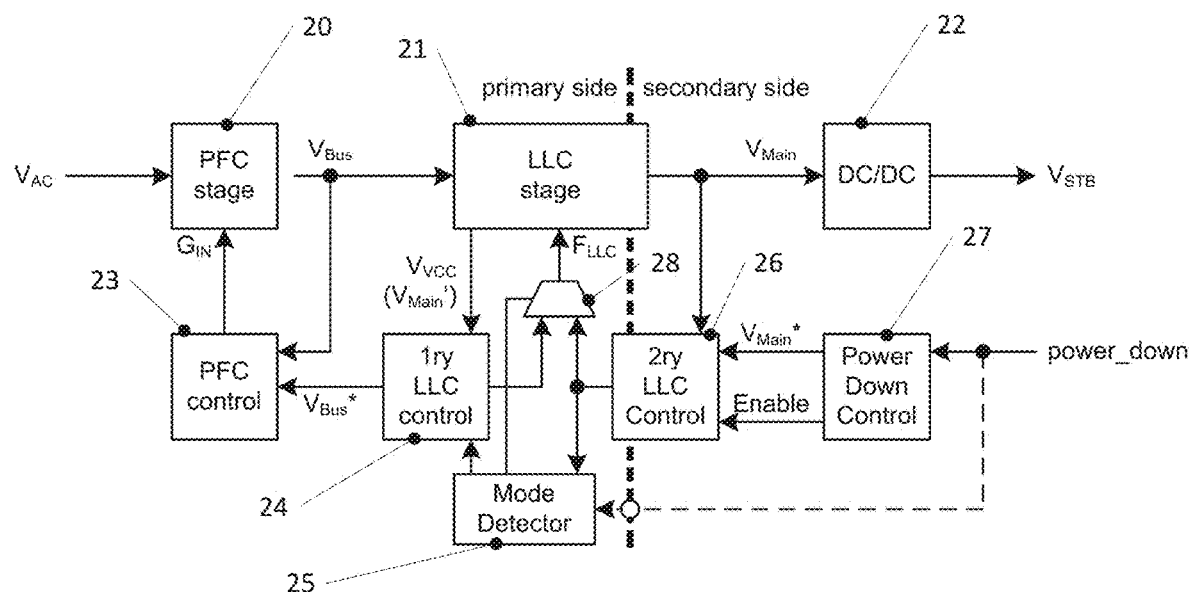
FIG. 2 is a block diagram illustrating a voltage converter system according to an embodiment.

To illustrate further, FIG. 2 is a schematic block diagram of a voltage converter system according to an embodiment, where techniques already discussed with reference to FIG. 1 may be employed. In particular, one or more of elements 23, 24, 25, 26, 27 or 28 of FIG. 2 may be implemented in controller 10 and in particular control circuit 15 thereof.

The representation of separate blocks or elements in FIG. 2 may then be seen as a representation of different functions of controller 10, and is not to be construed as indicating that these functions have to be implemented in different components.

The voltage converter system of FIG. 2 comprises a power factor correction (PFC) stage 20 receiving an AC voltage $V_{AC}$. PFC stage 20 rectifies the voltage and performs a power factor correction to output a voltage $V_{Bus}$.

The power factor of an AC electrical power system is defined as the ratio of the real power flowing to the load to the apparent power in the circuit. A power factor of less than 1 means that the voltage and current wave forms are not in phase, reducing the instantaneous product of the two wave forms. Power factor correction increases the power factor to bring it closer to 1. For some applications, such power factor correction is required, for example for voltage converters supplying high power. For example, for power supplies including voltage converters which deliver an output power greater than 75 W, a power factor correction producing a power factor increasing 0.9 may be required. Low power factors may increase losses in a power distribution system.

The voltage $V_{Bus}$ is provided to an LLC converter stage 21. Instead of LLC stage 21, other types of converters, for example other types of resonant converters, may be used. LLC converter stage 21 outputs a voltage $V_{Main}$. One or more DC/DC converters 22 may be provided to provide one or more output voltages based on voltage $V_{Main}$. For example, voltage converter 22 shown provides a standby voltage $V_{STB}$, which may be required for standby operation of an appliance. For example, some applications require different output voltages, and different DC/DC converters may be provided to provide such different voltages. In normal operation, a secondary side LLC control 26 receives the voltage $V_{Main}$ and generates a switching signal $F_{LLC}$ for LLC converter stage 21 to regulate voltage $V_{Main}$ to a desired (e.g. predefined) output voltage. During this normal operation, the voltage $V_{Bus}$ may be at a nominal (high) value, for example higher than input voltages $V_{AC}$ the system is designed for. For example, in some embodiments during normal operation $V_{Bus}$ may be 390 V or more.

In particular, secondary side LLC control 26 may regulate $V_{Main}$ to a predefined $V_{Main*}$ received from a power down controller 27. In normal operation, power down controller 27 supplies an appropriate value of $V_{Main*}$ such that the system of FIG. 2 may supply devices connected thereto.

During low power mode, a signal power_down indicates to power down control 27 that the system is to be operated in low power mode. In response thereto, power down control 27 in some implementations may disable secondary side LLC control 26 completely. In other embodiments, control 26 may be operated in a limited manner using for example also a lower voltage $V_{Main*}$, as will be explained below.

Furthermore, in low power mode, the system of FIG. 2 uses a primary side control 24 to perform a regulation based on a voltage $V_{VCC}$ used to supply a controller like controller 10 of FIG. 1. Primary side control 24 outputs a reduced bus voltage $V_{Bus*}$ to a PFC control 23 which controls PFC stage 20 using a signal $G_{IN}$, to reduce the bus voltage $V_{Bus}$ accordingly. In some embodiments, the voltage $V_{Bus}$ may be reduced by about 25%. For example, the bus voltage may be reduced from 390 V to 290 V. In this case, the PFC stage 20 may even be disabled when a high voltage is supplied as $V_{AC}$, for example a voltage $V_{AC}$ of 230 V rms (root mean square) plus minus 10% as used in Europe, which corresponds to a maximum voltage of 292 V. Only for lower input voltages, PFC stage 20 may need to be activated to generate such a reduced voltage. In this respect, it should be noted that in low power mode the output power of the voltage converter system is low, and in particular below limits where a power factor correction would be required, for example a limit of 75 W that is explained above. When PFC stage 20 is deactivated, therefore the voltage $V_{Bus}$ is only determined by VAC.

Furthermore, in the lower power mode, LLC stage 21 may be controlled with a fixed frequency $F_{LLC}$ by primary side control 24. In this case, also the voltage $V_{Main}$ is reduced. The voltages are selected or regulated such that the supply voltage $V_{VCC}$ is high enough to support the control illustrated in FIG. 2. Furthermore, the voltage $V_{Main}$ in some embodiments needs to be high enough such that a respective DC/DC converter 22 may still provide standby voltage $V_{STB}$. As a required standby voltage is usually lower than a voltage needed during full operation, $V_{Main}$ may be reduced compared to normal operation mode.

To enter and exit the low power mode, a mode detector 25 selects the corresponding output for multiplexer 28, i. e. either from primary control 24 or from secondary control 26.

PFC controller 23 may have a relatively low control bandwidth, for example about 20 Hz, while secondary LLC control 26 may have a relatively high control bandwidth, for example 2 kHz. In low power mode, the voltage $V_{Main*}$ may be set to a lower value. The mode detector 25 may detect this change of $V_{Main*}$ and activate primary LLC control 24.

In other embodiments, transitions may be detected by primary controller 24.

By performing a control based on $V_{VCC}$ in the low power mode of operation, a stable light load operation may be provided in some embodiments, as sufficient supply of a controller is ensured.

Exit from this low power mode is done by changing the signal power_down accordingly. In this case, control via secondary side control 26 is resumed, and the voltage $V_{Main*}$ is again set to the value required in normal operation. One criterion for switching back from low power mode to normal operation may be that $V_{Main'}$ is no longer above a minimum value $V_{Main*}$.

Figure 3A:
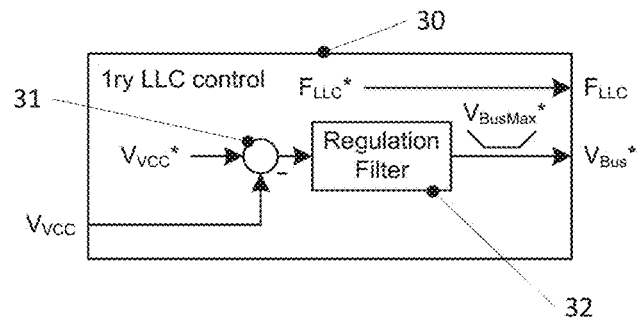
FIGS. 3A to 3C illustrate various examples for a primary control usable for example in the embodiment of FIG. 2.
Figure 3B:
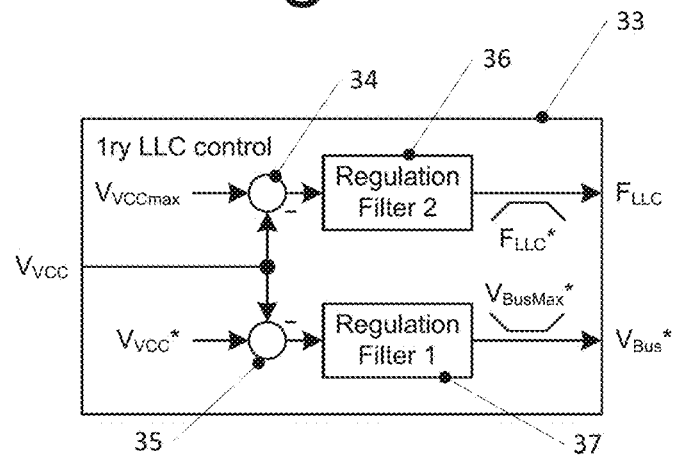

Example control schemes by primary side control 24 are now illustrated referring to FIGS. 3A to 3B.

In the example of FIG. 3A, a controller 30 is used as primary side control 24 of FIG. 2. In the example of FIG. 3A, a fixed switching frequency $F_{LLC}$ is provided to LLC stage 21. Moreover, using a subtractor 31 and a regulation filter 32, by controlling PFC stage 20 via PFC control 23, it is ensured that the voltage $V_{Bus}$ is sufficiently high to supply the controller with power. For example, if $V_{VCC}$ drops below a predefined value $V_{VCC}$, PFC stage 20 may be activated to increase $V_{Bus}$. If $V_{Bus}$ is sufficient without PFC stage 20, PFC stage 20 may be deactivated as explained above. The voltage $V_{VCC*}$ may be selected well above an undervoltage dropout of primary side gate drivers (gate drivers for driving switches of LLC stage 21) to ensure proper switching operation. Regulation filters used may have additional band selection filtering.

In some embodiments, $F_{LLC*}$ used in FIG. 3A as switching frequency FLLC may be the resonance frequency of the LLC converter so that the LLC stage has the highest efficiency.

In FIG. 3B, a controller 33 is used as primary side LLC control 24. A subtractor 35 and a regulation filter 37 operate in the same manner as subtractor 31 and regulation filter 32 of FIG. 3A. Furthermore, a current value $V_{VCC}$ in a subtractor 34 is subtracted from a maximum value $V_{VCCMax}$ and provided to a regulation filter 36. Based on an output of regulation filter 36, the switching frequency of LLC stage 21 is regulated if $V_{VCC}$ exceeds $V_{VCCMax}$. A high $V_{VCC}$ may be indicative of a very high input voltage $V_{AC}$, for example 305 V or higher. In this case, LLC stage 21 may be used to prevent the voltage $V_{VCC}$ from getting too high.

Figure 3C:
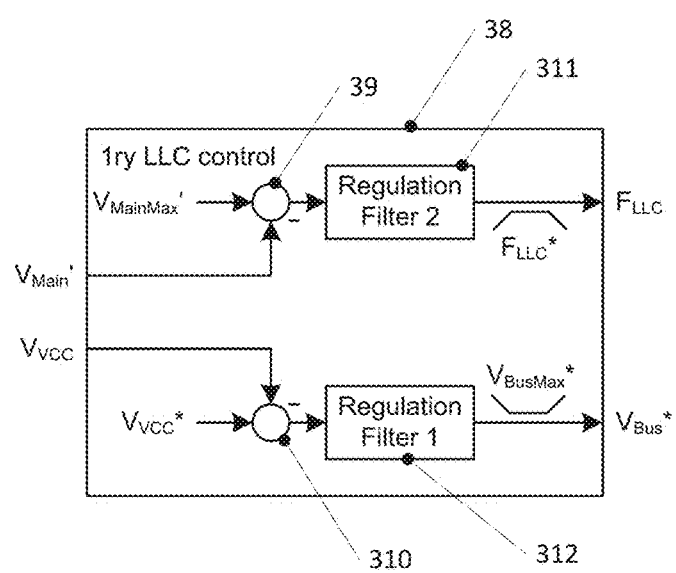

In FIG. 3C, a controller 38 is used as primary side LLC control 24, which in addition to the regulation of $V_{VCC}$ using a subtractor 310 and regulation filter 312 as explained for subtractor 31 and regulation filter 32 of FIG. 3A, a limited control based on the voltage $V_{Main}$ is used. Also in this case, using subtractor 39 and regulation filter 311, the switching frequency $F_{LLC}$ may be used to reduce the voltage $V_{Main}$ in case of very high input voltages $V_{AC}$, for example 305 V or higher but may be set to a fixed voltage otherwise. In this case, FIG. 3B and FIG. 3C implement the same general function, but in case of FIG. 3B the supply voltage $V_{VCC}$ is used as an indication when the voltage gets too high whereas in FIG. 3C the voltage $V_{Main}$ is used as an indication. The regulation filters of FIGS. 3A to 3C may be implemented as any suitable filter, for example to implement a control scheme like P (proportional), proportional integral (PI), proportional integral derivative (PID) control or a control based on threshold values. Other control schemes may also be used, and the controllers of FIGS. 3A to 3C serve only as an example.

Figure 4:
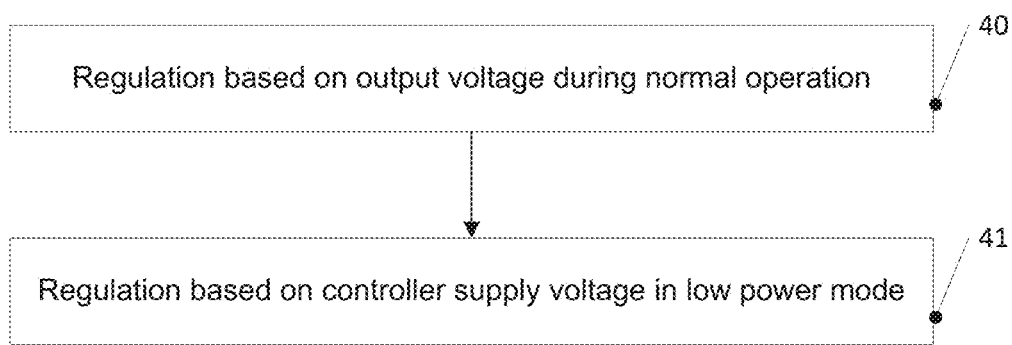
FIG. 4 is a flow chart illustrating a method according to an embodiment.

FIG. 4 is a flow chart illustrating a method according to an embodiment. The method of FIG. 4 will be described referring to FIGS. 1 to 3 and may be implemented using the controllers and system of FIGS. 1 to 3, but is not limited thereto.

At 40, the method comprises a regulation based on an output voltage of a converter stage during normal operation, for example based on $V_{Main}$ of FIG. 2. The regulation may include regulating a switching frequency of the converter stage.

At 41, the method comprises a regulation based on a controller supply voltage, for example VVCC, in a low power mode. In the low power mode at 41, a switching frequency of a converter stage may be fixed, or may be regulated only if a voltage like a bus voltage $V_{Bus}$ or an output voltage like voltage $V_{Main}$ exceeds a threshold value. The regulation at 41 may comprise regulating a power factor correction stage like stage 20 of FIG. 2.

It should be noted while the method of FIG. 4 is depicted as a series of normal operation and low power mode, normal operation and low power mode may be used alternatingly depending on load requirements, for example based on when a device supplied by the voltage converter is switched to a standby mode.

Figure 5:
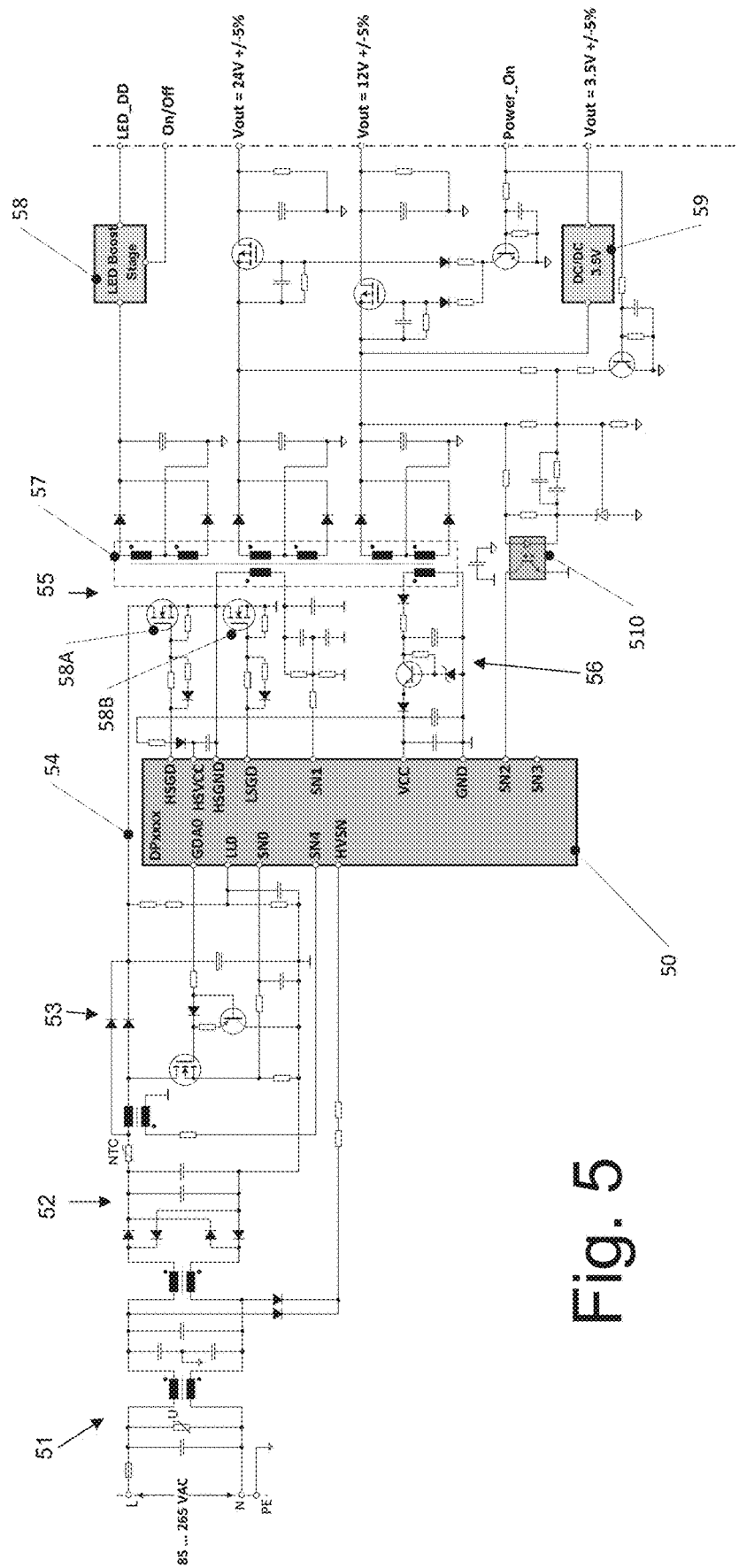
FIG. 5 illustrates an example of a conventional voltage converter system as an example environment for some embodiments.

Next, implementation of some of the techniques discussed herein in a specific environment, namely a power supply usable for a television or similar appliances, will be discussed with reference to FIGS. 5 to 8. For illustration purposes, FIG. 5 illustrates a conventional power supply for a television or similar device. It should be noted that while a television is used as an example in FIG. 5, similar power supplies using techniques discussed herein may be used in other applications, for example gaming applications or any other device which is to be supplied with one or more different DC voltages.

The power supply of FIG. 5 receives an input voltage at an input filter stage 51. In the implementation shown, the input voltage may for example be in a range between 85 V and 256 V AC (rms voltage of the alternating AC voltage), depending on the voltage of a mains power supply in a respective country, such that the power supply of FIG. 5 may be used in various countries. Input filter stage 51 in some implementations ensures electromagnetic compatibility (EMC). In the example of FIG. 5, input filter 51 is implemented as a common mode choke having two stages. The thus filtered input signal is rectified by a rectifier 52 and then provided to a power factor correction (PFC) stage 53. PFC stage 53 is controlled by a controller 50 to perform power factor correction as explained above. In the example of FIG. 5, PFC stage 53 is adapted to boost the received voltage, also referred to as bus voltage, at 54 by controlling a switch of PFC stage 53 in a discontinuous mode. Other conventional implementations of PFC stages may also be used.

The bus voltage at 54 is provided to a LLC converter 55 comprising a transformer 57 and primary side switches 58A, 58B. Transformer 57 provides galvanic isolation between input and output of the voltage converter system of FIG. 5. Controller 50 controls switching of switches 58A, 58B with a switching frequency to provide a desired output voltage. For regulation, a feedback via an optic coupler 510 is provided to controller 50, and regulation of switching of switches 58a, 58b is performed based on such feedback. Optical coupler 510 is used to maintain the galvanic isolation provided by transformer 57 and not destroy this isolation by a feedback loop.

Based on the output of LLC converter 55, in the example of FIG. 5 output voltages of 24 V and 12 V are provided. Furthermore, via a LED boost driver stage 58, power supply for light emitting diodes of a TV are provided. Finally, a DC/DC converter 59 provides an output voltage of 3.5 V, which is used during standby.

Standby is activated by providing a corresponding signal power_on. This signal causes a change of the feedback signal, which in turn causes a lowering of the output voltage provided by LLC converter 55. This leads to some power saving, but also leads to the LLC converter 55 not being operated at its optimum switching frequency.

Figure 6:
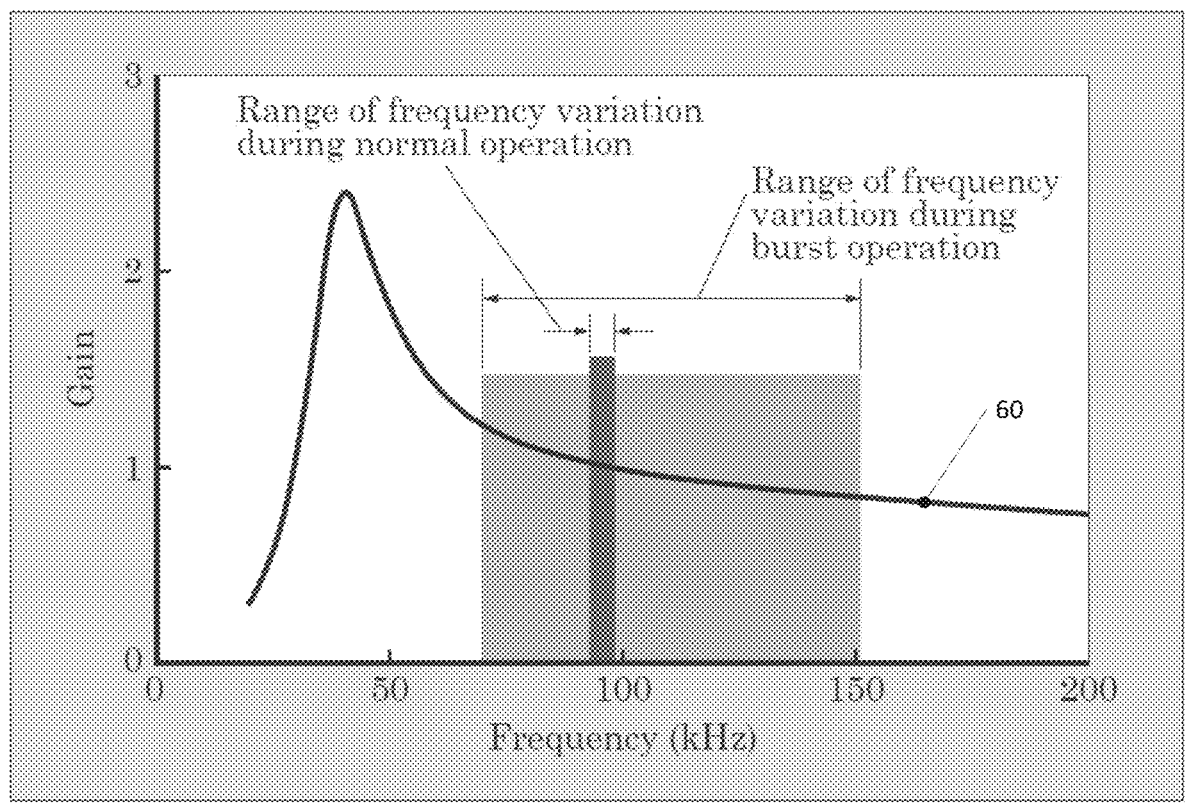
FIGS. 6 and 7 are graphs illustrating the behavior of a voltage converter system like the one of FIG. 5.

Furthermore, FIG. 6 illustrates the gain of the LLC converter versus switching frequency. As can be seen, the gain for a comparatively large variation of the frequency varies comparatively slightly, such that it may be difficult to regulate the LLC converter to a lower output voltage during low power mode.

In particular, as seen in FIG. 6 a lowering in the output voltage corresponds to a decrease in gain, and a significant decrease in gain can only be achieved by operating at a very high switching frequency, which in turn leads to higher switching losses.

Figure 7:
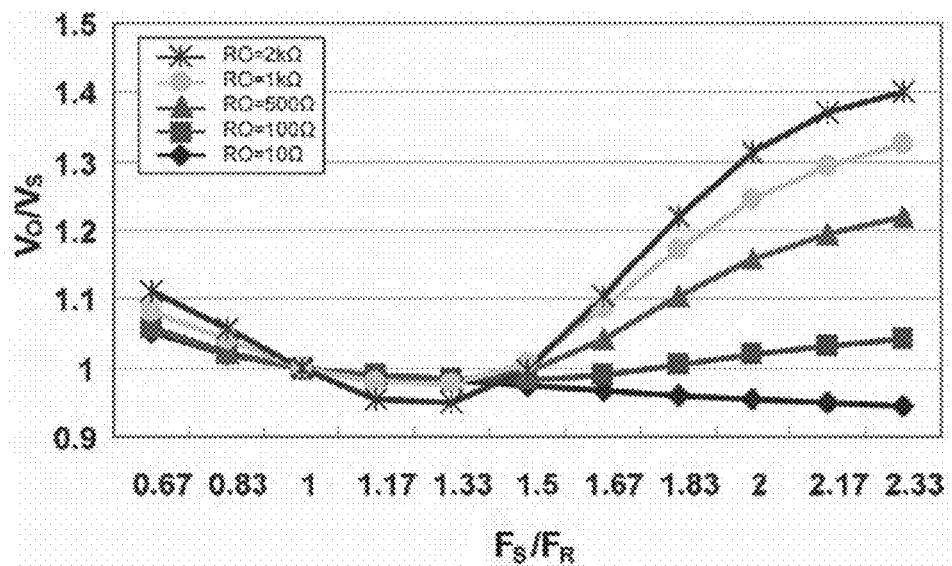

In addition a parasitic effect that may occur in LLC converter is illustrated in FIG. 7, which shows an increasing gain when operating at very light loads and higher switching frequencies. FIG. 7 shows the ratio of output voltage $V_O$ to supply voltage $V_S$ versus the ratio between the switching frequency $F_S$ of LLC converter 55 divided by the resonance frequency $F_R$ of the LLC converter. As can be seen, the gain behavior is load depending for very light loads and higher switching frequencies, which also may make output voltage regulation more difficult if the gain cannot be further reduced by increasing the switching frequency.

In particular, in the conventional approach of FIG. 5 two types of low power modes may be conventionally implemented. A first possibility uses a burst mode of the power factor correction stage and the LLC converter, burst mode meaning that the operation is discontinuous. As explained above, this implies setting the switching frequency of the LLC converter to high values, which increases switching losses. In this operating mode, further the bus voltage at 54 may be reduced by 10 to 20%. In a second possibility, the power factor correction is disabled, and only a LLC burst mode is used. This requires dimensioning the LLC converter for a wide input range, which may lead to higher losses in normal operation due to suboptimum design of the LLC converter.

Figure 8:
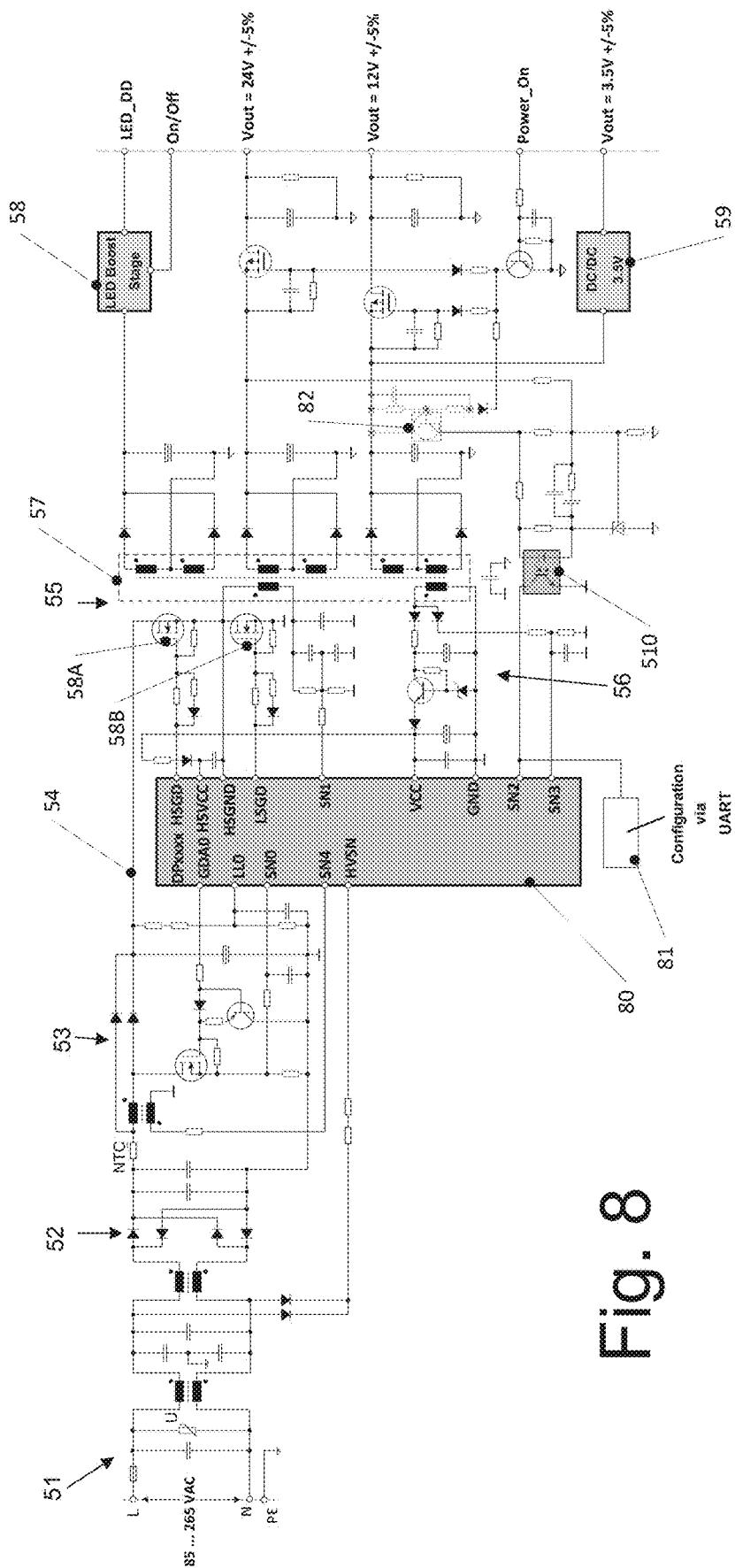
FIG. 8 illustrates a voltage converter system according to an embodiment.

FIG. 8 illustrates a voltage converter system according to an embodiment which is based on the voltage converter system of FIG. 5. Elements of the voltage converter system of FIG. 8 which correspond to the voltage converter system of FIG. 5 bear the same reference numerals and will not be described again in detail in order to avoid repetitions.

Instead of the conventional voltage converter controller 50 of FIG. 5, in the voltage converter system of FIG. 8 a voltage converter controller 80 is provided implementing the techniques discussed herein. In particular, voltage converter controller 80 of FIG. 8 may use different control modes as discussed with reference to FIGS. 1 and 4 in normal operation and in a low power mode.

In particular, in normal operation voltage converter controller 80 similar to the conventional controller 50 of FIG. 5 receives a feedback signal via optic coupler 510 and controls a switching frequency of switches 58A, 58B based on this feedback.

In low power mode, a corresponding signal is provided as signal power_on in FIG. 8. In this case, controller 80 controls the voltage converter according to one or more of the possibilities already discussed referring to FIGS. 3a to 3c. In particular, in an implementation controller 80 controls switches 58A, 58B to operate at an optimum frequency, for example at the resonance frequency of the LLC converter. Moreover, PFC stage 53 may be deactivated as long as a supply voltage VCC received by a controller 80 is above a predefined level. Deactivating PFC stage 53 reduces the bus voltage at 54, for example from 400 V to 300 V, with a corresponding reduction of output voltages. Nevertheless, during standby mode only the voltage output by DC/DC converter 59 is required to maintain the standby voltage (3.5 V output in the example of FIG. 8), for which an output voltage of the LLC converter 55 for example of 4 to 5 V is sufficient.

If the voltage VCC drops below a predefined level, for example PFC stage 53 may be activated to increase the bus voltage at 54. In other words, a regulation based on the received supply voltage is performed by controller 80.

Furthermore, as also explained referring to FIGS. 3B and 3C, in some embodiments the switching frequency of primary switches 58a, 58b may be modified in case the output voltage of LLC converter 55 gets too high, for example if VCC is above a threshold value cause $V_{VCCmax}$.

In addition to controller 80, compared to FIG. 5 in FIG. 8 an additional transistor 82 is provided. If the power-on signal power_on indicates a low power mode, transistor 82 essentially decouples optic coupler 510 and therefore the feedback path from the output voltage, and by the thus changed feedback information controller 80 may recognize entering low power mode. In other embodiments, transistor 82 may be omitted.

In addition to transistors 82, further transistors may be provided which for example may decouple (deactivate) the voltage outputs for 12 V, 24 V and/or for the LED in low power mode, to for example prevent leakage currents by devices coupled to the corresponding terminals, such that in low power mode only the 3.5V voltage is actually output.

At least some embodiments are defined by the examples given below:

Example 1

A voltage converter controller, comprising: a control circuit; a feedback terminal to receive a feedback signal from a secondary side of a voltage converter system; a supply input to receive a supply voltage; and a switching control output. The control circuit is configured to, in a normal mode of operation, output a switching control signal at the switching control output based on the feedback signal, and wherein, in a low power mode of operation, the voltage converter controller is configured to control the voltage converter system based on a supply voltage received at the supply voltage input.

Example 2

The voltage converter controller of example 1, wherein the control circuit in the low power mode is configured to output a switch control signal at the switch control terminal having a fixed frequency.

Example 3

The voltage converter controller of example 2, wherein the control circuit is configured to vary the frequency of the switch control signal from the fixed frequency only if one of the supply voltage and a feedback voltage based on an output voltage of the voltage converter exceeds a predefined value.

Example 4

The voltage converter controller of example 1, further comprising a primary power stage control output, wherein the control circuit is configured to output a primary stage control signal at the primary power stage control output in the low power mode of operation based on the supply voltage.

Example 5

The voltage converter controller of example 4, wherein the voltage converter controller is configured to deactivate the primary power stage if the supply voltage is above a threshold value.

Example 6

A voltage converter system, comprising:
a voltage converter stage, and
a voltage converter controller of example 1, wherein the voltage converter stage is configured to be controlled by a signal output from the switch control terminal.

Example 7

The voltage converter system of example 6, further comprising a feedback path coupled between an output of the voltage converter stage and the feedback terminal of the voltage converter controller.

Example 8

The voltage converter system of example 7, wherein the feedback path is configured to be deactivated in the low power mode.

Example 9

The voltage converter system of example 6, wherein the voltage converter stage comprises a resonant converter.

Example 10

The voltage converter system of example 6, wherein the voltage converter controller is implemented as defined in example 4, and wherein the system further comprises a primary power stage configured to output a voltage to the voltage converter stage, wherein the primary power stage is configured to be controlled by a signal output at the primary power stage control terminal.

Example 11

The voltage converter system of example 10, wherein the first power stage comprises a power factor correction circuit.

Example 12

The voltage converter system of example 6, wherein at least one output of the voltage converter stage is configured to be deactivated in the low power mode.

Example 13

A method for controlling a voltage converter system, comprising: in a normal mode of operation, controlling at least one of an operating frequency or peak current of a voltage converter stage of the voltage converter system based on an output voltage of the voltage converter stage; and in a low power mode of operation, controlling the voltage converter system based on a supply voltage to a controller of the voltage converter system.

Example 14

The method of example 13, wherein the controlling in the low power mode comprises controlling a first a power stage of the voltage converter system providing a voltage to the voltage converter stage based on the supply voltage, and operating the voltage converter stage with one of a fixed frequency or fixed peak current.

Example 15

The method of example 14, wherein the method comprises varying the frequency or peak current only if the supply voltage or a feedback voltage based on an output voltage of the voltage converter stage exceeds a predefined threshold.

Example 16

The method of example 14, wherein controlling the first power stage comprises deactivating the first power stage if the supply voltage is above a threshold.

Example 17

The method of example 14, wherein the first power stage comprises a power factor correction.

Example 18

The method of example 13, further comprising deactivating a feedback of the output voltage in the low power mode.

Example 19

The method of example 13, further comprising deactivating at least one output of the voltage converter system in the low power mode.

It should be noted that the above-described embodiments serve only as non-limiting examples and are therefore not to be construed as limiting.

What is claimed is:

1. A voltage converter controller, comprising:
   a control circuit;
   a feedback terminal configured to receive a feedback signal that is indicative of an output voltage at an output of a secondary side of a voltage converter system, wherein the output supplies power to a load;
   a supply input configured to receive a supply voltage that powers the control circuit; and
   a switching control output,
   wherein the control circuit is configured to, in a normal mode of operation, output a switching control signal at the switching control output based on the feedback signal so as to regulate the output voltage, and wherein, in a low power mode of operation, the voltage converter controller is configured to compare the supply voltage that powers the control circuit with a supply voltage threshold, and to control the voltage converter system based on a result of the comparison.

2. The voltage converter controller of claim 1, wherein the control circuit is further configured, in the low power mode, to output a low power switch control signal at the switching control output, wherein the low power switch control signal has a fixed frequency during a first interval.

3. The voltage converter controller of claim 2, wherein the control circuit is further configured to detect that the supply voltage exceeds a predefined supply value and/or that the feedback signal exceeds a predefined feedback signal threshold and, responsive to said detection, to vary the frequency of the low power switch control signal during a second interval so as to reduce the output voltage.

4. The voltage converter controller of claim 1, further comprising a primary power stage control output, wherein the control circuit is configured to output a primary stage control signal at the primary power stage control output in the low power mode of operation, wherein the primary stage control signal is based on the supply voltage.

5. The voltage converter controller of claim 4, wherein the voltage converter controller is configured to deactivate the primary power stage responsive to detecting that the supply voltage is above a threshold value.

6. The voltage converter controller of claim 4, wherein the voltage converter controller is configured, in the low power mode, to generate the primary stage control signal so as to regulate the supply voltage such that the supply voltage remains above a minimum supply voltage that is required for operation of the control circuit.

7. A voltage converter system, comprising:
   a voltage converter stage having an isolation transformer comprising a primary winding on a primary side of the voltage converter system and a secondary winding on a secondary side of the voltage converter system;
   an output for supplying power to a load, and which is electrically coupled to the secondary winding and which has an output voltage; and
   a voltage converter controller comprising a control circuit, a feedback terminal configured to receive a feedback signal that is indicative of the output voltage, a supply input configured to receive a supply voltage that powers the control circuit, and a switching control output,
   wherein the control circuit is configured to, in a normal mode of operation, output a switching control signal at the switching control output based on the feedback signal so as to regulate the output voltage,
   wherein, in a low power mode of operation, the voltage converter controller is configured to compare the supply voltage with a supply voltage threshold, and to control the voltage converter system based on a result of the comparison,
   wherein the voltage converter stage is configured to be controlled by a signal output from the switching control output.

8. The voltage converter system of claim 7, further comprising a feedback path that electrically couples an output of the voltage converter stage to the feedback terminal of the voltage converter controller.

9. The voltage converter system of claim 8, wherein the feedback path is configured to be deactivated in the low power mode, such that the output of the voltage converter stage is not provided to the feedback terminal and the switching control signal is not based on the feedback signal.

10. The voltage converter system of claim 7, wherein the voltage converter stage comprises a resonant converter.

11. The voltage converter system of claim 7, wherein the voltage converter controller further comprises a primary power stage control output, wherein the control circuit is configured to output a primary stage control signal at the primary power stage control output in the low power mode of operation, wherein the primary stage control signal is based on the supply voltage, wherein the voltage converter system further comprises a primary power stage configured to output a voltage to the voltage converter stage, and wherein the primary power stage is configured to be controlled by a signal output at the primary power stage control terminal.

12. The voltage converter system of claim 11, wherein the primary power stage comprises a power factor correction circuit.

13. The voltage converter system of claim 7, wherein at least one output of the voltage converter stage is configured to be deactivated in the low power mode.

14. A method for controlling a voltage converter system, the method comprising:
   in a normal mode of operation, controlling at least one of an operating frequency or peak current of a voltage converter stage of the voltage converter system based on an output voltage of the voltage converter stage; and in a low power mode of operation, comparing a supply voltage, used for powering a controller of the voltage convert system, with a supply voltage threshold, and controlling the voltage converter system based on a result of the comparison.

15. The method of claim 14, further comprising:

deactivating, in the low power mode of operation, a feedback of the output voltage such that the controlling of at least one of an operating frequency or a peak current is not based on the output voltage.

16. The method of claim 14, further comprising:

deactivating at least one output of the voltage converter system in the low power mode.

17. The method of claim 14, wherein controlling the voltage converter system in the low power mode of operation comprises controlling a first power stage of the voltage converter system, wherein the first power stage provides, to the voltage converter stage, a voltage that is based on the result of the comparison of the supply voltage of the controller with the supply voltage threshold, and operating the voltage converter stage with one of a fixed frequency or fixed peak current.

18. The method of claim 17, further comprising:

detecting that the supply voltage exceeds a predefined supply value and/or that the feedback signal exceeds a predefined feedback signal threshold; and responsive to said detection, varying the frequency or peak current so as to reduce the output voltage.

19. The method of claim 17, wherein controlling the first power stage comprises deactivating the first power stage responsive to detecting that the supply voltage is above a threshold.

20. The method of claim 17, wherein the first power stage comprises a power factor correction circuit.

* * * * *